(12) United States Patent
Worledge

(10) Patent No.: US 6,987,691 B2
(45) Date of Patent: Jan. 17, 2006

(54) EASY AXIS MAGNETIC AMPLIFIER

(75) Inventor: Daniel Christopher Worledge, Poughquag, NY (US)

(73) Assignee: International Business Machines Corporation, Armonk, NY (US)

(*) Notice: Subject to any disclaimer, the term of this patent is extended or adjusted under 35 U.S.C. 154(b) by 35 days.

(21) Appl. No.: 10/725,985

(22) Filed: Dec. 2, 2003

(65) Prior Publication Data

US 2005/0117389 A1    Jun. 2, 2005

(51) Int. Cl.
*G11C 11/14* (2006.01)
(52) U.S. Cl. .................. 365/171; 365/158; 365/173
(58) Field of Classification Search ............ 365/171, 365/158, 173; 257/296
See application file for complete search history.

(56) References Cited

U.S. PATENT DOCUMENTS

| | | | | |
|---|---|---|---|---|
| 5,841,692 A | * | 11/1998 | Gallagher et al. | 365/173 |
| 6,381,171 B1 | * | 4/2002 | Inomata et al. | 365/173 |
| 6,531,723 B1 | * | 3/2003 | Engel et al. | 257/200 |
| 6,831,857 B2 | * | 12/2004 | Amano et al. | 365/173 |

* cited by examiner

*Primary Examiner*—Anh Phung
(74) *Attorney, Agent, or Firm*—Ryan, Mason & Lewis, LLP; Wan Yee Cheung, Esq.

(57) ABSTRACT

Techniques for improved semiconductor device performance are provided. In one aspect, a semiconductor device is provided. The device comprises at least one free magnetic layer, and a magnetic amplifier interacting with the free magnetic layer comprising two or more magnetic layers with at least one nonmagnetic layer therebetween. The nonmagnetic layer may be configured to provide parallel exchange coupling J of the magnetic layers in a range of $$0 < J < \frac{4\pi t^2 M_s^2 n_y}{b},$$

the magnetic layers having a long axis and a short axis, wherein t is a thickness of each magnetic layer, $M_s$ is magnetization, $n_y$ is a demagnetizing factor defined along the short axis of the magnetic layers and b is a diameter along a short axis of the magnetic layers. A method for switching a semiconductor device having at least one free magnetic layer is also provided.

19 Claims, 5 Drawing Sheets

100

ASTROID

EASY AXIS MAGNETIC AMPLIFIER

FIELD OF THE INVENTION

The present invention relates to semiconductor devices and, more particularly, to techniques for improving semiconductor device performance.

BACKGROUND OF THE INVENTION

Semiconductor devices, i.e., magnetic random access memory (MRAM) devices use magnetic memory cells to store information. A cell is typically a submicron piece of magnetic material. The magnetic memory cell may be an ellipse, having the dimensions, e.g., of 300 nanometers (nm) by 600 nm in area and five nm thick.

Information is stored in the device as the direction of the magnetization of a free layer in the magnetic memory cell, pointing either right or left, to store either a "1" or a "0." When the cell is sitting in a zero applied magnetic field, the magnetization of the cell is stable, pointing either right or left. The application of a magnetic field can switch the magnetization of the free layer from right to left, and vice versa, to write information to the cell.

One of the objectives of MRAM is to have a low operating power and a small area. These objectives require a low switching field for the magnetic memory cell, because a low switching field uses a low switching current, which uses less power, and because smaller currents require smaller switches, which occupy less space. Therefore, another objective of MRAM is to reduce the field required to switch the cells.

In MRAM devices there are an array of magnetic memory cells. One cell is written by sending current down a bit line and a word line. In theory, the cell at the intersection of these two lines experiences both an easy and a hard axis field, and thus switches. The easy axis is the axis along the direction the magnetization typically lies and the hard axis is perpendicular to this easy axis. Cells on the column line only feel the easy axis field (a half select field), and the cells on the row line only feel the hard axis field (half select field). These half selected cells are not meant to be switched. However, during actual operation of an MRAM device, factors, such as variations in the device, cause some of the half selected cells to be arbitrarily switched, placing the reliability and validity of the stored data in question.

Thus, it would be desirable to have a semiconductor device with a low operating power and a small area, and wherein the arbitrary switching of half selected cells is reduced or eliminated.

SUMMARY OF THE INVENTION

The present invention provides techniques for improved semiconductor device performance. In one aspect of the invention, a semiconductor device is provided. The device comprises at least one free magnetic layer, and a magnetic amplifier interacting with the free magnetic layer comprising two or more magnetic layers with at least one nonmagnetic layer therebetween. The nonmagnetic layer may be configured to provide parallel exchange coupling J of the magnetic layers in a range of $$0 < J < \frac{4\pi t^2 M_s^2 n_y}{b},$$

the magnetic layers having a long axis and a short axis, wherein t is a thickness of each magnetic layer, $M_s$ is magnetization, $n_y$ is a demagnetizing factor defined along the short axis of the magnetic layer and b is a diameter along the short axis of the magnetic layers.

In another aspect of the invention, a method for switching a semiconductor device having at least one free magnetic layer comprises the following steps. An easy axis amplifier interacting with the free magnetic layer is provided comprising two or more magnetic layers with at least one nonmagnetic layer therebetween. The amplifier is written to produce a dipole field to switch the device.

A more complete understanding of the present invention, as well as further features and advantages of the present invention, will be obtained by reference to the following detailed description and drawings.

DETAILED DESCRIPTION OF PREFERRED EMBODIMENTS

Figure 1:
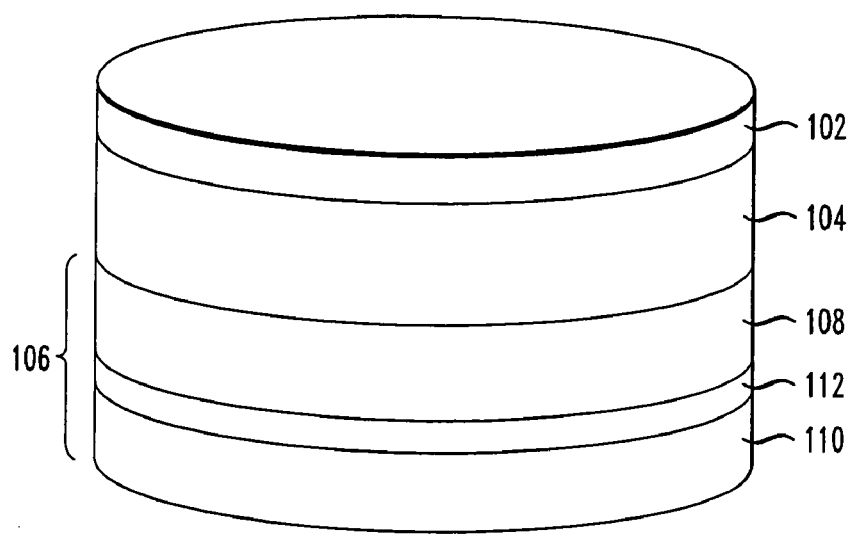
FIG. 1 is a diagram illustrating an exemplary semiconductor device according to an embodiment of the present invention.

FIG. 1 is a diagram illustrating an exemplary semiconductor device. In FIG. 1, semiconductor device 100, which may be used, for example, as a magnetic storage element in a magnetic random access memory (MRAM) device, includes free magnetic layer 102, nonmagnetic spacer layer 104 and easy axis amplifier 106, which comprises magnetic layers 108 and 110 separated by nonmagnetic layer 112.

The magnetization of free magnetic layer 102 can be changed to write information to the device. Further, as will be described in detail below, nonmagnetic spacer layer 104 prevents direct exchange coupling of free magnetic layer 102 and easy axis amplifier 106.

As presented in the description herein, the layers of semiconductor device 100 are assumed to be elliptical in shape. However, in accordance with the teachings herein, the layers of semiconductor device 100 may have any suitable shape or configuration, such as, but not limited to, circular, rectangular or hexagonal shape. The exact shape of the device layers is not of primary importance.

According to the techniques presented herein, a magnetic amplifier is used to amplify a small applied field into a large dipole field that writes the device. For ease of reference, the following description will be divided into the following sections; (I) Writing MRAM, (II) Definitions of Types of Fields, (III) Easy Axis Amplifier, (IV) Basic Idea of the Composite Structure and (V) Methods to Achieve Weak Parallel Coupling.

(I) Writing MRAM

Figure 2:
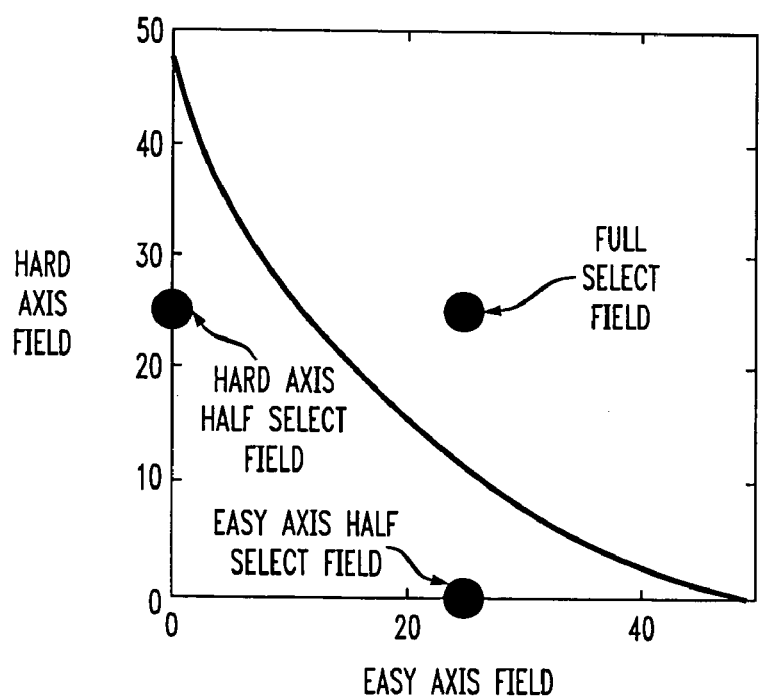
FIG. 2 is an exemplary conventional Stoner-Wohlfarth astroid.

Writing a semiconductor device, such as semiconductor device 100 described above in conjunction with the description of FIG. 1, will be presented as follows. The curve in easy axis x and hard axis y fields, which shows when the semiconductor device switches, is typically called an astroid. FIG. 2 illustrates a portion of an exemplary conventional Stoner-Wohlfarth astroid. In FIG. 2, the dots indicate full and half select fields. For fields larger than the astroid boundary, the device switches, whereas for fields smaller than the astroid boundary, the device does not switch.

The goal is to design an astroid wherein half select fields lie within the astroid boundary and full select fields lie outside of the astroid boundary. In order to have sufficient write margins, one wants the astroid boundary to be such as to allow large half select fields that do not switch the device and, simultaneously, allow small full select fields that do switch the device.

The astroid shape and the size of the switching fields depends on the device design. Some conventional designs employ a single layer shaped like an ellipse. The single domain theory for an elliptical single layer is referred to as Stoner-Wohlfarth theory, and the astroid shape associated therewith is the Stoner-Wohlfarth astroid, as shown in FIG. 2. The present techniques provide a new improved shaped astroid that is better than the Stoner-Wohlfarth astroid in that it writes in very small full select fields, and yet does not switch in much larger half select fields.

(II) Definitions of Types of Fields

Presented herein are definitions of the fields present during operation of a semiconductor device, e.g., semiconductor device 100 described above in conjunction with the description of FIG. 1. The switching field is often referred to as coercivity $H_c$. In addition, any small magnetic layer creates its own magnetic field which exists outside the magnetic layer and in a direction opposite to the direction of its magnetization. This magnetic field is called the dipole field $H_d$.

(III) Easy Axis Amplifier

Figure 3:
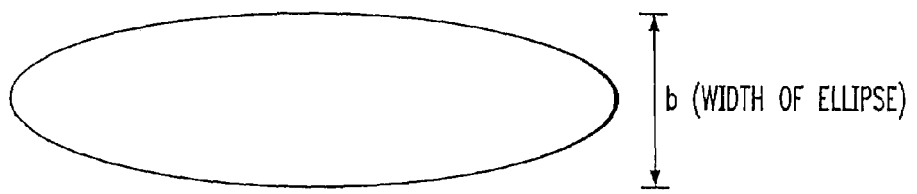
FIG. 3 is a diagram illustrating an exemplary easy axis amplifier configuration and dimensions according to an embodiment of the present invention.
Figure 3:
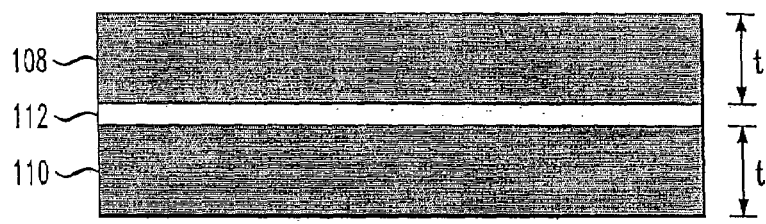

As was described above in conjunction with the description of FIG. 1, an easy axis amplifier comprises two magnetic layers coupled together with a small amount of parallel exchange coupling, the dimensions of which are shown in FIG. 3. FIG. 3 is a diagram illustrating an exemplary easy axis amplifier configuration and dimensions. The magnetic layers 108 and 110 (separated by nonmagnetic layer 112) may be of an equal thickness, t. As shown in FIG. 3, the magnetic layers may be elliptical. However, as was mentioned above, the magnetic layers may be of any suitable shape, e.g., circular.

The amplifier structure, as shown in FIG. 3, can be made to produce a large dipole field $H_d$, yet switch in a small threshold field $H_t$ (as compared to its dipole field). According to single domain theory, $H_t$ is given by the expression $$H_t = \frac{\frac{8\pi^2 n_x M_S^2}{b} - 2J}{tM_S},$$

which only holds for the range $$0 < J < \frac{4\pi t^2 M_S^2 n_x}{b},$$

wherein $M_s$ is magnetization, b is the width of the ellipse, t is the thicknesses of each magnetic layer, J is the exchange coupling in ergs per square centimeter (erg/cm$^2$) and $n_x$ and $n_y$ are the reduced demagnetizing factors defined along the x-axis, the long axis, and the y-axis, the short axis, respectively ($n_x$=0.32 and $n_y$=0.9 for an aspect ratio of two). Note, that by adjusting J to be close to $$\frac{4\pi t^2 M_S^2 n_x}{b},$$

$H_t$ can be made to be close to zero.

Figure 4A:
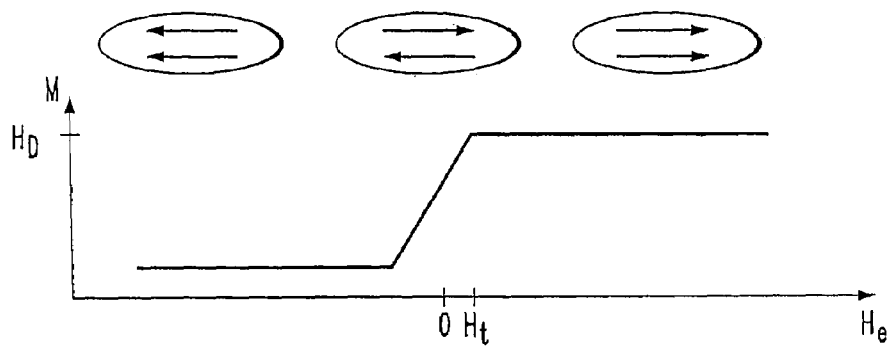
FIG. 4A is a hysteresis loop for an exemplary easy axis amplifier according to an embodiment of the present invention.

The corresponding hysteresis loop of this amplifier structure is shown in FIG. 4A. FIG. 4A is a hysteresis loop for an exemplary easy axis amplifier. In FIG. 4A, the easy axis dipole field (proportional to the net magnetic moment in the easy axis direction) is plotted as a function of applied easy axis field $H_e$.

In a zero applied magnetic field, there is no moment, namely because the two magnetic layers are anti-parallel. In small applied magnetic fields, the magnetic layers scissor out until they are parallel, i.e., when $H_e$=$H_t$. At this point, the magnetic layers produce a large dipole field $H_d$. $H_d$ is given by the expression $$H_d = \frac{8\pi t n_x M_S}{b}.$$

Note, that because of J, $H_d$>>$H_t$. The direction of the magnetizations of the two layers is shown schematically at the top of FIG. 4A for negative applied magnetic fields, zero applied magnetic field and positive applied magnetic fields.

Figure 4B:
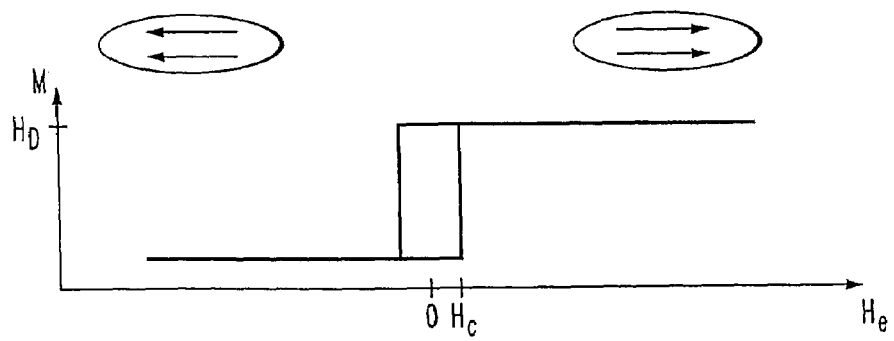
FIG. 4B is another hysteresis loop for an exemplary easy axis amplifier according to an embodiment of the present invention.

When $$\frac{4\pi t^2 M_S^2 n_x}{b} < J < \frac{4\pi t^2 M_S^2 n_y}{b},$$

the loop is an open loop, with coercivity $$H_c = \frac{2J - \frac{8\pi t^2 n_x M_S^2}{b}}{tM_S},$$

as shown in FIG. 4B. FIG. 4B is another hysteresis loop for an exemplary easy axis amplifier. Again, by adjusting J to be close to $$\frac{4\pi t^2 M_S^2 n_x}{b},$$

$H_c$ can be made to be close to zero. Either loop shape works for an amplifier, as long as J is close to $$\frac{4\pi t^2 M_S^2 n_x}{b}$$

such that either $H_t$ or $H_c$ is small.

(IV) Basic Idea of the Composite Structure

There are two ingredients to the exemplary composite semiconductor device structure, e.g., the structure described in conjunction with the description of FIG. 1, an easy axis amplifier and a free layer. The easy axis amplifier should produce a relatively large dipole field $H_d$ and switch in a relatively small threshold field $H_t$ (or coercive field). The free layer should have a, relatively large coercivity $H_c$ and a low dipole field $H_{fl}$. Namely, the free layer should have a coercivity larger than $H_d-H_t-H_{fl}$ such that the free layer does not switch in an easy axis field alone.

Figure 5:
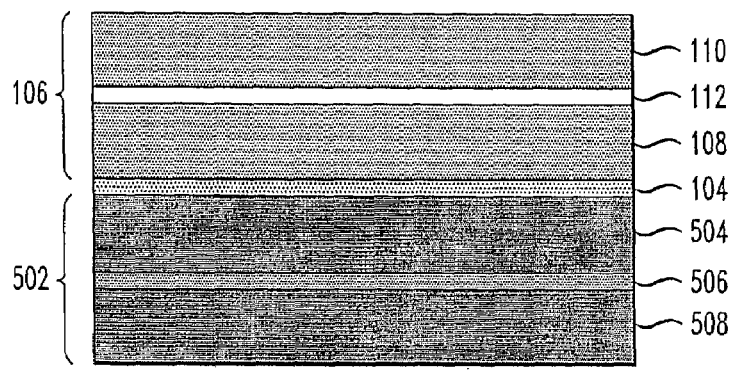
FIG. 5 is a diagram illustrating an exemplary semiconductor configuration with a free magnetic layer comprising two tightly anti-parallel coupled magnetic layers according to an embodiment of the present invention.

The free layer should also have a small dipole field $H_{fl}$ so that the free layer does not disturb the amplifier too much. The free layer may comprise an ellipse with a large amount of intrinsic anisotropy. It could also comprise an ellipse composed of two magnetic layers tightly anti-parallel coupled, as shown in FIG. 5. FIG. 5 is a diagram illustrating an exemplary semiconductor configuration with a free magnetic layer comprising two highly anti-parallel coupled layers. As shown in FIG. 5, this exemplary semiconductor device comprises easy axis amplifier 106 (namely magnetic layers 110 and 108 separated by nonmagnetic layer 112). Easy axis amplifier 106 is separated from free magnetic layer 502 by nonmagnetic spacer layer 104. Free magnetic layer 502 comprises tightly anti-parallel coupled magnetic layers 504 and 508 separated by strong anti-parallel coupling spacer layer 506.

If the free magnetic layer comprises two tightly anti-parallel coupled layers, each of the two magnetic layer has a small amount of intrinsic anisotropy. If the two layers are of substantially the same thickness, then there is little net moment (i.e., resulting in a small dipole field) and a large coercivity (due to the intrinsic anisotropy).

The free magnetic layer may be deposited on top of, or beneath, the amplifier. The free magnetic layer is separated from the amplifier by a nonmagnetic spacer layer which provides substantially no coupling, such that the free magnetic layer and the amplifier interact essentially only by dipole fields, as described above in conjunction with FIG. 1.

Suppose, by way of example, that the free magnetic layer is pointing to the right, and it is desired to write it to the left. A field may be applied to the right to write the amplifier at roughly $H=H_t+H_{fl}$. Enough field must be applied to overcome the dipole field from the free magnetic layer, in addition to the threshold field. The free layer now experiences an applied field of $H_t+H_{fl}$, to the right, and a dipole field from the amplifier of $H_d$, to the left, for a total of $H_d-H_t-H_{fl}$ to the left.

Since $H_c>H_d-H_t-H_{fl}$, this applied field will not write the free layer to the left. Increasing the applied field will not write it either, as this increased applied field only decreases the net field that the free magnetic layer experiences. Applying a very large negative field $-H_c-H_d$ would write the free magnetic layer, and should be avoided. If a small hard axis field were applied when $H=H_d-H_t-H_{fl}$, then the free layer does write via the Stoner-Wohlfarth process. Therefore, according to the techniques presented herein, the free magnetic layer will only write if both a small hard axis field and a small easy axis field are applied.

Figure 6A:
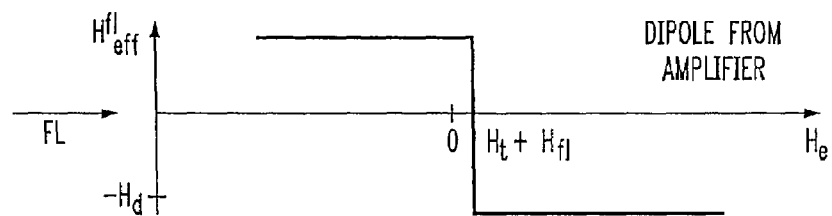
FIGS. 6A–C are hysteresis loops for an exemplary set of applied fields according to an embodiment of the present invention.
Figure 6B:
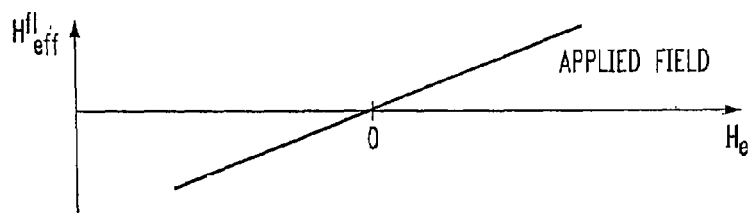
Figure 6C:
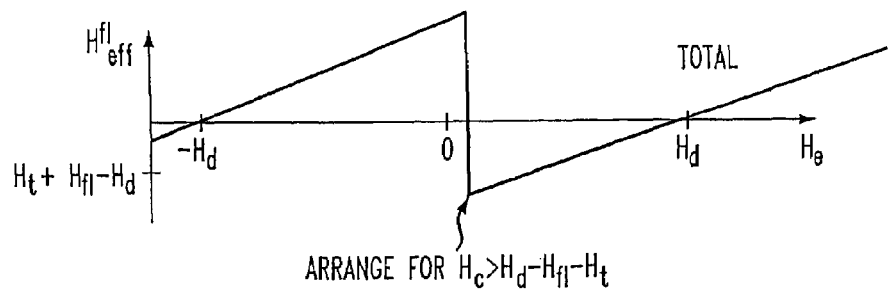

This set of fields is depicted in FIGS. 6A–C. FIGS. 6A–C are hysteresis loops for an exemplary set of applied fields. Namely, FIGS. 6A–C show the effective fields that the free magnetic layer experiences, as a function of easy axis applied magnetic field, assuming the free magnetic layer is pointing to the right.

An illustrative dipole field experienced from the amplifier is shown in FIG. 6A. Because the free magnetic layer is pointing to the right, in a zero applied magnetic field, the amplifier points to the left. Thus in a zero applied magnetic field, the free layer experiences a positive field from the dipole field of the amplifier.

At the small positive field $H_t+H_{fl}$, the amplifier switches so that the free magnetic layer experiences a negative field from the dipole field of the amplifier. An illustrative applied field that the free layer experiences is shown in FIG. 6B. The sum of the dipole field from the amplifier and the applied field that the free magnetic layer experiences is shown in FIG. 6C.

Figure 7:
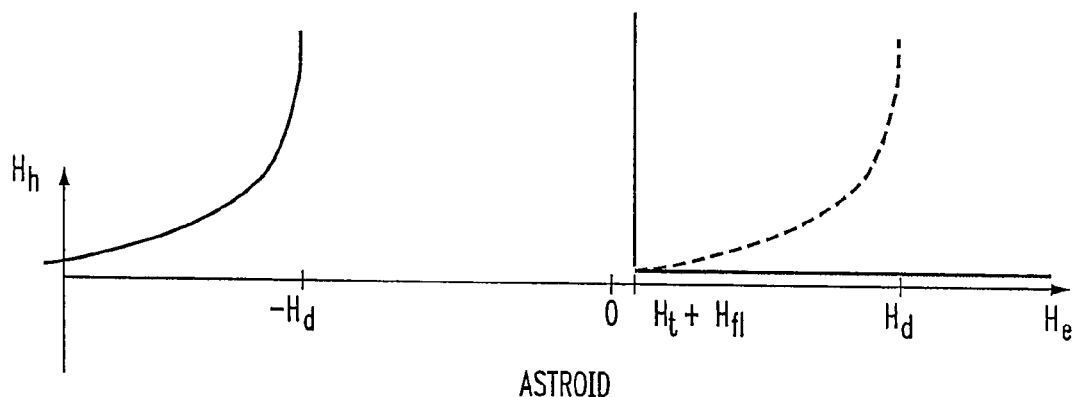
FIG. 7 is an astroid of an exemplary semiconductor device according to an embodiment of the present invention.

FIG. 7 shows an illustrative astroid expected from this exemplary configuration. Only for very large negative easy axis fields $-H_c-H_d$ will the free magnetic layer switch with no hard axis field applied. The usual Stoner-Wohlfarth astroid is also shown plotted in FIG. 7, offset by $-H_d$. This area of the plot is shown merely for completeness, because these fields are too large to be of interest.

At the very small easy axis field $H_t+H_{fl}$ it is also possible to switch the free magnetic layer if a small hard axis field is also applied. Again, the usual Stoner-Wohlfarth astroid is plotted in FIG. 7, offset by $H_d$. The astroid is drawn as a dotted boundary. The actual switching astroid is given by the solid L-shaped curve which gives the minimum fields for which the free layer switches. This L-shaped astroid represents an ideal astroid for MRAM. Namely, the free layer switches in very small fields ($H_t+H_{fl}$), and the write margins are large because the half select fields can be much larger than the full select field.

(V) Methods to Achieve Weak Parallel Coupling

There are many ways to get the two magnetic layers of the amplifier, e.g., the amplifier described above in conjunction with the descriptions of FIG. 1 and FIG. 3, to be weakly parallel coupled. A preferred method is to use an element, or alloy, in the nonmagnetic layer, e.g., nonmagnetic layer 112 of FIG. 1, which provides the correct amount of exchange coupling. There are many such alloys, including, but not limited to alloys comprising one of the following: ruthenium, osmium, rhenium, rhodium, molybdenum, iridium, chromium, copper, vanadium and combinations comprising at least one of the foregoing.

Another method that may be employed to weakly parallel couple the magnetic layers of the amplifier is to use a nonmagnetic layer, e.g., nonmagnetic layer 112 of FIG. 1, which gives very large parallel coupling (for example ruthenium), and then add a dusting layer to reduce this coupling. For example, one or both interfaces, or the middle of the ruthenium layer, could be dusted with a few Angstroms of another material which has substantially no coupling (or much smaller coupling), thus reducing the net coupling.

A further method that may be employed to weakly parallel couple the magnetic layers of the amplifier is to have the two magnetic layers separated by only a thin layer of a nonmagnetic material, e.g., nonmagnetic layer 112 of FIG. 1, with pinholes in it. The nonmagnetic material serves to largely decouple the two layers, while the pinholes allow the two layers to be parallel coupled, but only weakly parallel coupled. A different method is to use Neel coupling by making the interfaces rough, however, this is often not preferred because interface roughness has other deleterious effects.

EXAMPLES

Example 1

Figure 8:
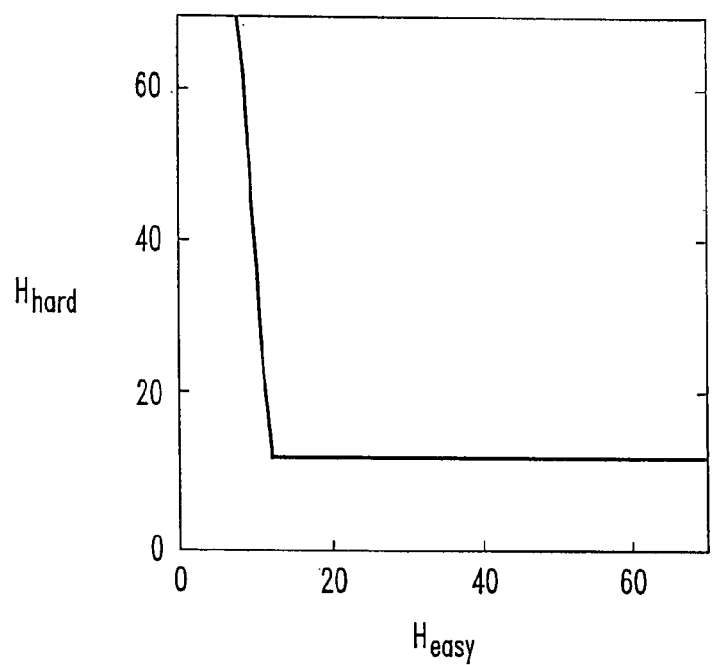
FIG. 8 is an astroid calculated using the single domain theory for an exemplary composite semiconductor device structure according to an embodiment of the present invention.

FIG. 8 shows an illustrative astroid calculated using the single domain theory for an exemplary composite semiconductor device structure. The composite semiconductor device structure comprised a free layer consisting of a single thin layer (1.5 nanometers (nm)) with a large amount of intrinsic anisotropy (80 Oersteds (Oe)). The amplifier is composed of two layers, each four nm thick, weakly coupled together by parallel exchange coupling. The astroid shows the expected L-shaped behavior.

Example 2

Figure 9:
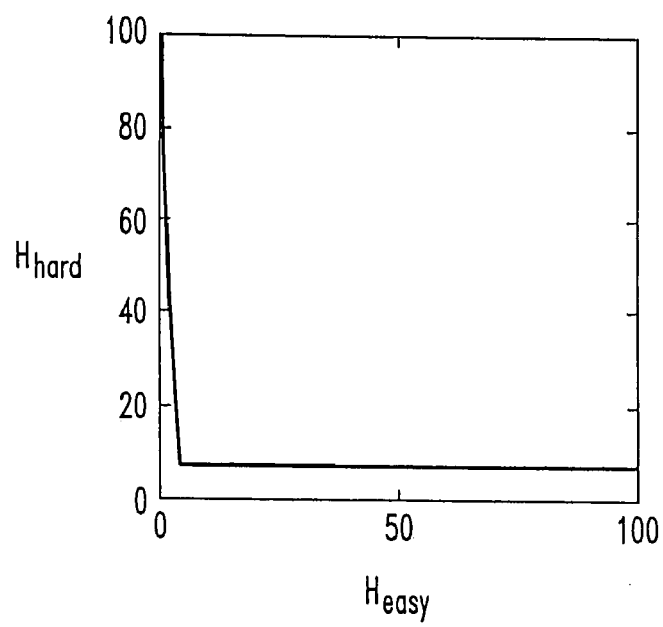
FIG. 9 is an astroid calculated using the single domain theory for another exemplary composite semiconductor device structure according to an embodiment of the present invention.

FIG. 9 shows an illustrative astroid calculated using the single domain theory for another exemplary composite semiconductor device structure. This structure has a free layer comprising two magnetic layers (1.5 nm and 1.6 nm thick) strongly anti-parallel coupled together, each with two Oe of intrinsic anisotropy. This configuration effectively creates a free layer with a net thickness of only 0.1 nm and a large intrinsic anisotropy of 2*(1.6+1.5)/(1.6−1.5)=62 Oe. The amplifier employed has the same configuration as that in the structure of FIG. 8, above.

Example 3

Figure 10:
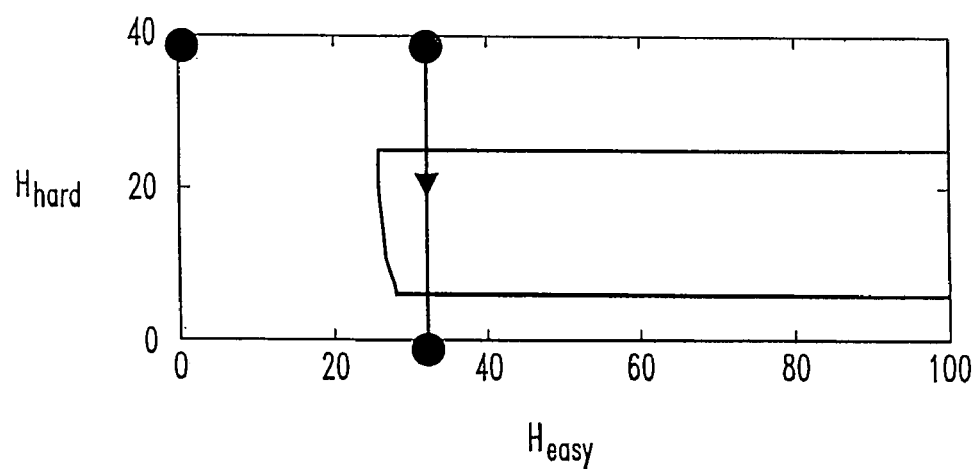
FIG. 10 is an astroid calculated using the single domain theory for another exemplary composite semiconductor device structure according to an embodiment of the present invention.

FIG. 10 shows an illustrative astroid calculated using the single domain theory for another exemplary composite semiconductor device structure. Here, the same amplifier as that described in conjunction with the description of FIG. 8, above, is employed. Here the free layer is a single layer, four nm thick, with an intrinsic anisotropy of 94 Oe. At large hard axis fields, the astroid is shown to close up again. This is due to canting of the amplifier structure by the dipole field of the free layer, an effect that was ignored in the discussion above. This closing up of the astroid provides even larger write margins by allowing even larger hard axis half select fields, without switching. In order to take advantage of this feature most effectively, the hard axis field should be removed first. This is shown in FIG. 10. The easy and hard axis fields can be applied in any order. It does not matter if the hard axis field is set to a value larger than the closed region, as shown by the dot in FIG. 10. Then, the hard axis field should be removed first. This ensures that the applied field moves through the open part of the astroid so that the bit is written. Finally, the easy axis field should be removed.

Although illustrative embodiments of the present invention have been described herein, it is to be understood that the invention is not limited to those precise embodiments, and that various other changes and modifications may be made by one skilled in the art without departing from the scope or spirit of the invention.

What is claimed is:

1. A semiconductor device comprising:
   at least one free magnetic layer; and
   a magnetic amplifier interacting with the free magnetic layer and comprising two or more magnetic layers with at least one nonmagnetic layer therebetween.

2. The device of claim 1, wherein the nonmagnetic layer is configured to provide parallel exchange coupling J of the magnetic layers in a range of $$0 < J < \frac{4\pi t^2 M_s^2 n_y}{b},$$

the magnetic layers having a long axis and a short axis, wherein t is a thickness of each magnetic layer, $M_s$ is magnetization, $n_y$ is a demagnetizing factor defined along the short axis of the magnetic layers and b is a diameter along the short axis of the magnetic layers.

3. The device of claim 1, wherein the nonmagnetic layer is configured to provide parallel exchange coupling J of the magnetic layers such that a switching threshold field $H_t$ associated with the magnetic amplifier is substantially zero.

4. The device of claim 1, wherein the nonmagnetic layer is configured to provide parallel exchange coupling J of the magnetic layers such that a coercivity $H_c$ associated with the magnetic amplifier is substantially zero.

5. The device of claim 1, wherein the nonmagnetic layer is configured to provide parallel exchange coupling J of the magnetic layers such that a threshold field $H_t$ and a coercivity $H_c$ associated with the magnetic amplifier are substantially zero.

6. The device of claim 1, further comprising a nonmagnetic spacer layer between the free magnetic layer and the magnetic amplifier.

7. The device of claim 6, wherein the nonmagnetic spacer layer prevents coupling of the free magnetic layer and the magnetic amplifier.

8. The device of claim 1, wherein the free magnetic layer and the magnetic amplifier interact by dipole fields.

9. The device of claim 1, comprising two or more free magnetic layers tightly anti-parallel coupled together.

10. The device of claim 1, wherein the nonmagnetic layer comprises an alloy.

11. The device of claim 10, wherein the alloy comprises an element selected from the group consisting of ruthenium, osmium, rhenium, rhodium, molybdenum, iridium, chromium, copper, vanadium and combinations comprising at least one of the foregoing.

12. The device of claim 1, wherein the free layer has an elliptical shape.

13. The device of claim 1, wherein the layers of the amplifier have an elliptical shape.

14. The device of claim 1, wherein the amplifier comprises an easy axis amplifier.

15. The device of claim 1, wherein the amplifier is deposited on top of the free layer.

16. The device of claim 1, wherein the amplifier is deposited beneath the free layer.

17. A method for switching a semiconductor device having at least one free magnetic layer, the method comprising the steps of:

providing an easy axis amplifier interacting with the free magnetic layer and comprising two or more magnetic layers with at least one nonmagnetic layer therebetween; and writing the amplifier to produce a dipole field to switch the device.

18. An integrated circuit device including at least one semiconductor device, the at least one semiconductor device comprising:

at least one free magnetic layer; and a magnetic amplifier interacting with the free magnetic layer and comprising two or more magnetic layers with at least one nonmagnetic layer therebetween.

19. The integrated circuit device of claim 18, wherein the integrated circuit device comprises a magnetic random access memory.

* * * * *